United States Patent [19]

Rao et al.

[11] Patent Number: 4,983,571

[45] Date of Patent: Jan. 8, 1991

[54] METHOD OF PRODUCING $YBA_2CU_3O_{6+x}$ SUPERCONDUCTORS WITH HIGH TRANSITION TEMPERATURES

[75] Inventors: A. Srinivasa Rao, Arnold; Om P. Arora, Silver Spring; Louis F. Aprigliano, Riva, all of Md.

[73] Assignee: The United States of America as represented by the Secretary of the Navy, Washington, D.C.

[21] Appl. No.: 472,008

[22] Filed: Jan. 30, 1990

[51] Int. Cl.$^5$ .............................................. H01L 39/12
[52] U.S. Cl. .......................................... 505/1; 264/66; 505/725; 505/779; 505/780
[58] Field of Search .............................. 264/56, 61, 65; 505/775, 776, 779, 780, 781, 809, 1

[56] References Cited

U.S. PATENT DOCUMENTS 4,826,808   5/1989   Yurek et al. ............................ 505/1

FOREIGN PATENT DOCUMENTS 0316042   5/1989   European Pat. Off. ............ 505/781

OTHER PUBLICATIONS

Wallace et al., *Journal of Superconductivity*, "Processing High-Density, Fine Grained $Ba_2YCu_3O$, Superconductors" (1988).
Goodenough, *Mat. Res. Bull.*, "Oxygen Ordering ... in $YBa_2Cu_3O_{7-8}$" (1988).
Matsuda et al., *The American Physical Society*, "Electronic Properties of $Ba_2Y_{1-x}Pr_xCu_3O_{7-8}$" (Aug. 1988).
Orlando et al., *Phys. Review Letters*, "Upper Critical Fields ... $YBa_2Cu_3O_{7-y}$" (May, 1987).
Yuzhen, *International Journal of Modern Physics*, "Superconductors with ... Ln–Ba–Cu–O System" (1987).

*Primary Examiner*—James Lowe
*Assistant Examiner*—Christopher A. Fiorilla
*Attorney, Agent, or Firm*—Luther A. Marsh; John H. Stowe

[57] ABSTRACT

A method for improving the superconducting transition temperature of the $MBa_2Cu_3O_x$ where M is selected from the group consisting of Y, Er, Eu, Yb, Dy and Ho and where x is a value of from 6 to 7 ceramic by utilizing specific sequences of heat treating times and temperatures in conjunction with the use of silver oxide in making superconducting devices or wires for ultimate use in motors, generators and electrical circuits.

14 Claims, No Drawings

METHOD OF PRODUCING $YBa_2Cu_3O_{6+x}$ SUPERCONDUCTORS WITH HIGH TRANSITION TEMPERATURES

The invention described herein may be manufactured and used by or for the Government of the United States of America for governmental purposes without the payment of any royalties thereon or therefor.

BACKGROUND OF THE INVENTION

1. Field of the Invention

This invention is directed to a method to improve the superconducting transition temperature of the $YBa_2Cu_3O_{6\ to\ 7}$ ceramic.

2. Brief Description of the Prior Art

Traditionally the $YBa_2Cu_3O_{6\ to\ 7}$ superconductor is made by well known ceramic processing methods. These methods Include starting by mixing and grinding powders of yttrium oxide, barium carbonate and copper oxide. This mixture, after thorough grinding, is heat treated or calcined at temperatures between about 800° C. to about 1050° C. in order to drive the carbonate from the mixture. The powders, after ball milling and mixing a second time, are sintered to densify and join the powders at temperatures from about 800° C. to about 1050° C. The powders are then annealed after sintering in oxygen or air at about 400° C. to about 600° C. to be sure the oxygen atoms in each molecule of $YBa_2Cu_3O_{6+}$ is between 6 to 7 oxygen atoms. The prior art teaches that by adding silver oxide to the powder mixtures it is possible to increase the onset of the superconducting transition temperature to as high as 95K from the more usual 88K to about 90K. Unfortunately, the density and quality was not as required for use.

The density and quality of the finished product, particularly when the superconductor is to be a reliable wire, electrical device or other product made with this material, is of upmost importance. This invention yields a reliable superconductor product as set out below, and in particular improves the superconducting transition temperature of the $YBa_2Cu_3O_{6\ to\ 7}$.

SUMMARY OF THE INVENTION

This invention provides a method for making an improved ceramic superconductor comprising:

(a) mixing an oxide of yttrium ($Y_2O_3$) with barium carbonate and copper oxide powders in a ratio of about 50 grams of the group element oxide to about 170 grams of $BaCO_3$ to about 105 grams of CuO, (Equivalent amount of mixtures of the oxides of erbium, europium, ytterbium, dysprosium and holmium also work as well to replace $Y_2O_3$).

(b) ball milling the mixture with zironia balls for at least one hour, (c) calcining the mixture at a temperature of 940° C.±2° C. with a heating sequence of 2° C. per minute from room temperature to 200° C., (d) maintaining the mixture at the 200° C. temperature for at least about sixty minutes, (e) heating the mixture at 3° C. per minute until a temperature of 940° C.+or−2° C. is reached, (f) maintaining the mixture at the 940° C.+or−2° C. for three hundred minutes, (g) cooling the mixture to room temperature at a rate of 1° C. per minute, (h) adding silver oxide in powdered form to the mixture in an amount of from about 1 to about 20 weight percent, (i) ball milling the mixture containing silver oxide for at least one hour, (j) compacting the mixture, (k) sintering the mixture at 920° C.+or−2° C. by heating the mixture at 2° C. per minute from room temperature to 200° C., maintaining the temperature at 200° C. for 60 minutes and then resuming the heating at 3° C. per minute until a temperature of 920° is reached.

(l) maintaining the mixture at 920° C.+or−2° C. for three hundred minutes, and (m) cooling the mixture to room temperature at a rate of 1° C. per minute.

OBJECTS OF THE INVENTION

It is therefore an object of the present invention to improve the superconducting transition temperature of the $MBa_2Cu_3O_x$ where M is selected from the group consisting of Y, Er, Eu, Yb, Dy and Ho $Ba_2Cu_3O_x$ and where x is a value of from 6 to 7.

A further object of the present invention is to utilize specific sequences of heat treating times and temperatures in conjunction with the use of silver oxide to improve the superconducting transition temperature of the Y or Er, Eu, Yb, Dy and Ho $Ba_2Cu_3O_{6\ to\ 7}$ ceramics.

Another object of the present invention is to make an improved material for use in making superconducting devices or wires for use in motors, generators and electrical circuits. With other objects in view, this invention provides a method for making an improved ceramic superconductor by combining a heat treating sequence with the addition of silver oxide to the oxide selected from the group consisting of $YBa_2Cu_3O_x$, $ErBa_2Cu_3O_x$, $EuBA_2Cu_3O_x$, $YbBa_2Cu_3Ox$, $DyBa_2Cu_3Ox$ and $HoBa_2Cu_3Ox$ where x is a number from 6 to 7.

DETAILED DESCRIPTION OF THE INVENTION

The present Invention provides a unique method for making an improved ceramic superconductor. One specific example of the invention provides a method to improve the superconducting transition temperature of the $YBa_2Cu_3O_{6\ to\ 7}$ ceramic. This method describes the use of specific sequences of heat treating times and temperatures in conjunction with silver oxide additions to bring out the improvement. It is observed that using the heat treatment sequence without the silver oxide additions or using the silver oxide additions without the heat treating sequence will not yield the improvement.

The $YBa_2Cu_3O_{6\ to\ 7}$ superconductor example is made by mixing yttrium oxide, barium carbonate and copper oxide powders in a preferable ratio of 50 grams of $Y_2O_3$ to 170 grams of $BaCO_3$ to 105 grams of CuO. These preferable ratios yield an improvement to the ductility of the extruded finished product. It is observed that the ratios of 50 grams of $Y_2O_3$ to 175 grams of $B_aCO_3$ to 100 grams of CuO will work; however, the quality is inadequate as to the ductility of the extruded finished products It is observed that an extra amount, of CuO through small, yields a true improvement in the final quality of the finished product. The mixture of these three (3) compounds is then ball milled with zirconia balls for at least one hour. The mixture, after the ball milling, is calcined at 940° C.+or−2° C. with a specific heating sequence of 2° C. per minute from room temperature to 200° C. Upon reaching 200° C. the mixture is maintained at 200° C. for at least 30 minutes, but preferably 60 minutes. Heating of the mixture is then resumed at 3° C. per minute until a temperature of 940°C+or−2° C. is reached. The mixture is maintained at this temperature for 300 minutes after which it is cooled to room temperature at 1° C. per minute. Silver oxide in powdered form at from about 1 to about 20 weight percent is added to the mixture at room temperature. It is observed after many experiments that about five (5) weight percent of silver oxide is preferred in reaching the transition temperature, even though other weight percent's of silver oxide also work. The mixture, now including the silver oxide, is ball milled with zironia balls for at least one (1) hour. This mixing time is critical in order to obtain ultimate optimum finished product properties. The mixture is then compacted in order to prepare the mixture for the final heat treatment which further reacts the powders and sinters them together. This sintering process is carried out at 920° C.+or−2° C. To reach this temperature, the mixture is heated at 2° C. per minute from room temperature to 200° C. Upon reaching 200° C. the mixture is maintained at 200° C. for at least thirty (30) minutes, but preferably sixty (60) minutes. Heating of the mixture is then resumed at 3° C. per minute until a temperature of 920° C. is reached. The mixture is held at 920° C.+or−2° C. for three hundred (300) minutes after which it is cooled to room temperature at 1° C. per minute. It is observed that the final sintering temperature of 920° C. is important to the quality of the finished product. For example, after the silver oxide is added to the mixture, it is observed that if heated to 930° C. undersirable melting and distribution of the silver is found that degrades the superconducting transition temperature; and, if heated to 910° C. it is observed that too much porosity is in the finished product, that is, the compacts or pellets formed with the final mixture will not be dense enough to make a quality finished product.

It is also observed through man experiments that cooling the mixture at rates greater than 5° C. per minute from the calcining or sintering temperatures will inconsistently produce superconductors with transition temperatures in excess of 77K. It is observed that 3° C. per minute of cooling yields a good compromise between the desire to limit the time of the heat treatment an the necessity for consistent results in the final product.

It is also observed through many experiments that maintaining the hold times at less than two (2) hours at the sintering and calcining temperatures yields inconsistent results. It is observed that five (5) hours yields the desired results for the final product.

It has also been observed that utilizing Erbium, Europium, Ytterbium, Dysprosium and Holmium instead of Yttrium gives comparable consistent results in the final product.

The advantages and new features of the invention are that combining the heat treating sequence with the addition of silver oxide to the $YBa_2CU_3O_{6 \text{ to } 7}$ superconductor results in a superconductor that has a higher transition temperature than a $YBa_2Cu_3O_{6 \text{ to } 7}$ S superconductor made without silver oxide additions or made with silver oxide additions but without the specific heat treating sequence. The increase in the transition temperature of the $YBa_2Cu_3O_{6 \text{ to } 7}$ superconductor in this invention improves the reliability of any wire, electrical device or other product made thereof.

What is claimed is:

1. A method for making an improved ceramic superconductor comprising:
    (a) mixing an oxide selected from the group consisting of $Y_2O_3$, $Er_2O_3$, $Eu_2O_3$, $Yb_2O_3$, $Dy_2O_3$ and $Ho_2O_3$ with barium carbonate and copper oxide powders in a ratio of about 50 grams in the case of $Y_2O_3$, 83 grams for $Er_2O_3$, 76 grams for $Eu_2O_3$, 86 grams for $Yb_2O_3$, 80 grams for $Dy_2O_3$, 82 grams of $Ho_2O_3$ to about 70 grams of $BaCO_3$ to about 105 grams of $CuO$,
    (b) ball milling the mixture with zironia balls for at least one hour;
    (c) calcining the mixture at a temperature of 940°C.+or−2° C. with a heating sequence of 2° C. per minute from room temperature to 200° C.,
    (d) maintaining the mixture at the 200° C. temperature for at least about sixty minutes,
    (e) heating the mixture at 3° C. per minute until a temperature of 940° C.+or −2° C. is reached,
    (f) maintaining the mixture at the 940° C.+or−2° C. for three hundred minutes,
    (g) cooling the mixture to room temperature at a rate of 1° C. per minute,
    (h) adding silver oxide in powdered form to the mixture in an amount of from about 1 to about 20 weight percent,
    (i) ball milling the mixture containing silver oxide for at least one hour,
    (j) compacting the mixture,
    (k) sintering the mixture at 920° C.+or=2° C. by heating the mixture at 2° C. per minute from room temperature to 200° C., maintaining the temperature at 200° C. for 60 minutes and then resuming the heating at 3° C. per minute until a temperature of 920° C. is reached,
    (l) maintaining the mixture at 920° C.+or−2° C. for three hundred minutes, and
    (m) cooling the mixture to room temperature at a rate of 1° C. per minute.

2. A method for making an improved ceramic superconductor in accordance with claim 1 wherein the metal in the oxide selected from the group consisting of Yttrium, Erbium, Europium, Ytterbium, Dysprosium and Holmium is Yttrium.

3. A method for making an improved ceramic superconductor in accordance with claim 1 wherein the metal in the oxide selected from the group consisting of Yttrium, Erbium, Europium, Ytterbium, Dysprosium and Holmium is Erbium.

4. A method for making an improved ceramic superconductor in accordance with claim 1 wherein the metal in the oxide selected from the group consisting of Yttrium, Erbium, Europium, Ytterbium, Dysprosium and Holmium is Europium.

5. A method for making an improved ceramic superconductor in accordance with claim 1 wherein the metal in the oxide selected from the group consisting of Yttrium, Erbium, Europium, Ytterbium, Dysprosium and Holmium is Ytterbium.

6. A method for making an improved ceramic superconductor in accordance with claim 1 wherein the metal in the oxide selected from the group consisting of Yttrium, Erbium, Europium, Ytterbium, Dysprosium and Holmium is Dysprosium.

7. A method for making an improved ceramic superconductor in accordance with claim 1 wherein the metal in the oxide selected from the group consisting of Yttrium, Erbium, Europium, Ytterbium, Dysprosium and Holmium is Holmium.

8. A method for making an improved ceramic superconductor in accordance with claim 1 wherein silver oxide in powdered form is added to the mixture in an amount of about five (5) weight percent.

9. A method for making an Improved ceramic superconductor in accordance with claim 8 wherein the metal in the oxide selected from the group consisting of Yttrium, Erbium, Europium, Ytterbium, Dysprosium and Holmium is Yttrium.

10. A method for making an improved ceramic superconductor in accordance with claim 8 wherein the metal in the oxide selected from the group consisting of Yttrium,-Erbium, Europium, Ytterbium, Dysprosium and Holmium is Erbium.

11. A method for making an improved ceramic superconductor in accordance with claim 8 wherein the metal in the oxide selected from the group consisting of Yttrium, Erbium, Europium, Ytterbium, Dysprosium and Holmium is Europium.

12. A method for making an improved ceramic superconductor in accordance with claim 8 wherein the metal in the oxide selected from the group consisting of Yttrium Erbium, Europium, Ytterbium, Dysprosium and Holmium is Ytterbium.

13. A method for making an improved ceramic superconductor in accordance with claim 8 wherein the metal in the oxide selected from the group consisting of Yttrium, Erbium, Europium, Ytterbium, Dysprosium and Holmium is Dysprosium.

14. A method for making an improved ceramic superconductor in accordance with claim 8 wherein the metal in the oxide selected from the group consisting of Yttrium, Erbium, Europium, Ytterbium, Dysprosium and Holmium, is Holmium.

* * * * *